United States Patent
Zeng

(10) Patent No.: US 10,629,584 B1
(45) Date of Patent: Apr. 21, 2020

(54) INTEGRATED CIRCUITS INCLUDING AN ELECTROSTATIC DISCHARGE DEVICE AND METHODS OF PRODUCING THE SAME

(71) Applicant: Globalfoundries Singapore Pte. Ltd., Singapore (SG)

(72) Inventor: Jie Zeng, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 16/193,317

(22) Filed: Nov. 16, 2018

(51) Int. Cl.
| H01L 27/02 | (2006.01) |
| H01L 29/06 | (2006.01) |
| H01L 29/735 | (2006.01) |
| H01L 21/265 | (2006.01) |
| H01L 21/74 | (2006.01) |
| H01L 21/761 | (2006.01) |
| H01L 29/66 | (2006.01) |

(52) U.S. Cl.
CPC .... *H01L 27/0248* (2013.01); *H01L 21/26513* (2013.01); *H01L 21/74* (2013.01); *H01L 21/761* (2013.01); *H01L 29/0646* (2013.01); *H01L 29/6625* (2013.01); *H01L 29/735* (2013.01)

(58) Field of Classification Search
CPC ... H01L 27/0248; H01L 21/74; H01L 29/735; H01L 29/6625; H01L 21/761; H01L 29/0646; H01L 21/26513
See application file for complete search history.

(56) References Cited

U.S. PATENT DOCUMENTS

| 7,639,464 B1 | 12/2009 | Vashchenko et al. |
| 7,723,823 B2 | 5/2010 | Gill et al. |
| 2015/0364471 A1* | 12/2015 | Chang ................. H01L 29/7816 257/338 |

OTHER PUBLICATIONS

Chen et al., "Design and Layout of a High ESD Performance NPN Structure for Submicron BiCMOS/Bipolar Circuits", IEEE, 1996, pp. 227-232.

* cited by examiner

*Primary Examiner* — Kyoung Lee
(74) *Attorney, Agent, or Firm* — Thompson Hine LLP; Anthony Canale

(57) ABSTRACT

Integrated circuits including an electrostatic discharge device and methods of forming the integrated circuits are provided herein. In an embodiment, an integrated circuit includes an n-type epitaxy layer, a segmented p-well, a p-type buried layer, and a collector region. The segmented p-well is formed in the n-type epitaxy layer. The segmented p-well defines and laterally surrounds a spacing region of the n-type epitaxy layer. The p-type buried layer is formed in the spacing region. The p-type buried layer laterally extends into the segmented p-well about the spacing region and impedes current flow between an underlying portion of the n-type epitaxy layer in relation to the p-type buried layer and an overlying portion of the n-type epitaxy layer in the spacing region. The collector region of the electrostatic discharge device is formed in the overlying portion of the n-type epitaxy layer in the spacing region.

20 Claims, 3 Drawing Sheets

INTEGRATED CIRCUITS INCLUDING AN ELECTROSTATIC DISCHARGE DEVICE AND METHODS OF PRODUCING THE SAME

TECHNICAL FIELD

The technical field generally relates to integrated circuits including an electrostatic discharge device and methods of producing the same, and more particularly relates to integrated circuits with an electrostatic discharge device and methods of producing the same in which holding voltage can be adjusted with minimal effect on failure current.

BACKGROUND

Many electronic components within integrated circuits are sensitive to electrostatic discharge (ESD) and other forms of voltage spikes. An ESD event is a sudden flow of electricity between two or more objects. The electrical flow can be initiated in several ways, such as electrical contact, a short, or a dielectric breakdown. The static electricity developed by walking across a carpet can be enough to damage some devices, where static electricity often has very high voltage. In many cases, an ESD event will damage or destroy one or more electronic components in an integrated circuit, and ESD events are common.

Various techniques are used to prevent electronic component damage due to ESD events. For example, manufacturers may utilize electrostatic protective areas that are essentially free of static electricity. This can involve several measures, such as avoiding the use of highly charging materials, grounding objects and/or workers, and controlling humidity. Many integrated circuits are transported in special containers that are designed to prevent damage from ESD events, such as anti-static bags that include partially conductive plastics or other conductive materials. However, it is difficult or impossible to prevent ESD events from damaging integrated circuits while in use by employing special handling measures. For example, an integrated circuit included in a motor vehicle is exposed to many different conditions, so prevention of ESD events is difficult. ESD events for many handheld devices, portable devices, and even fixed electronic devices are common, and protective measures may be prohibitive. Some integrated circuits include design features to protect electronic components, but such protection has limits.

To protect the integrated circuits from ESD events while in use, many integrated circuits are provided with an ESD circuit, where the ESD circuit includes an ESD transistor that is designed to act during an ESD event. More particularly, ESD circuits are generally designed to remain quiescent during normal operation of the integrated circuit and to turn on during an ESD event. A typical ESD device has a trigger voltage (Vt) that is higher than operating voltage (Vo) of the integrated circuit, with the ESD device remaining in the quiescent state until applied voltage reaches or exceeds Vt. Once Vt is reached or exceeded for the ESD device, the ESD device becomes activated and the current increases to a holding point, which is demarcated by a peak decrease in voltage versus current increase. During the ESD event, once the holding point is exceeded, current continues to increase along with voltage until a failure point is reached, as demarcated by a sharp decrease in voltage with further increase in current. The current and voltage at the failure point is often designated as It2 and Vt2, respectively.

To configure ESD devices for particular integrated circuits, the ESD devices are designed according to desired specifications for Vt, Vh, Vt2, and It2. However, ESD devices that are configured for lower Vh are often vulnerable to latch-up failure or short circuit such that higher Vh is often desired for certain integrated circuits. However, Vh is generally correlated to It2, with increasing Vh generally leading to undesirably lower It2. Thus, typical ESD device configurations present a trade-off between established Vh and It2 for the ESD devices.

Accordingly, it is desirable to provide integrated circuits including ESD devices that exhibit a minimal change in failure current (It2) even when configured to have a higher holding voltage. In addition, it is desirable to provide methods of forming the integrated circuits that include the ESD devices. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits including an electrostatic discharge device and methods of forming the integrated circuits are provided herein. In an embodiment, an integrated circuit includes an n-type epitaxy layer, a segmented p-well, a p-type buried layer, and a collector region. The segmented p-well is formed in the n-type epitaxy layer, and the segmented p-well defines and laterally surrounds a spacing region of the n-type epitaxy layer. The p-type buried layer is formed in the spacing region of the n-type epitaxy layer. The p-type buried layer laterally extends into the segmented p-well about the spacing region and impedes current flow between an underlying portion of the n-type epitaxy layer in relation to the p-type buried layer and an overlying portion of the n-type epitaxy layer in the spacing region. The collector region of the electrostatic discharge device is formed in the overlying portion of the n-type epitaxy layer in the spacing region.

In another embodiment, an integrated circuit is provided that includes an n-type epitaxy layer, a segmented p-well, a p-type buried layer, n-type emitter contacts, and a collector region. The segmented p-well is formed in the n-type epitaxy layer, and the segmented p-well defines and laterally surrounds a spacing region of the n-type epitaxy layer. The p-type buried layer is formed in the spacing region of the n-type epitaxy layer. The p-type buried layer has a distinguishable doping profile as compared to the segmented p-well. The p-type buried layer impedes current flow between an underlying portion of the n-type epitaxy layer in relation to the p-type buried layer and an overlying portion of the n-type epitaxy layer in the spacing region. A base region includes first p-type subregions, a second p-type subregion, and a p-type base contact. The first p-type subregions of the electrostatic discharge device are formed in lateral portions of the segmented p-well relative to the spacing region, with the first p-type subregions formed on opposing sides of the spacing region. The second p-type subregion is formed in the segmented p-well. The p-type base contact is formed in the second p-type subregion. The second p-type subregion has a distinguishable doping profile as compared to the segmented p-well and the p-type base contact has a distinguishable doping profile as compared to the second p-type subregion. The second p-type subregion and the p-type base contact form a ring disposed about the segmented p-well with the first p-type subregions laterally encompassed by the ring of the second p-type subregion and the p-type base contact. The n-type emitter contacts are formed in the respective first p-type subregions. The collector region is formed in the overlying portion of the n-type epitaxy layer in the spacing region.

In another embodiment, a method of forming an integrated circuit that includes an electrostatic discharge device is provided. The method includes providing a semiconductor substrate that includes an n-type buried layer and an n-type epitaxy layer formed over the n-type buried layer. P-type dopant ions are implanted into the n-type epitaxy layer to form a segmented p-well in the n-type epitaxy layer, with the segmented p-well defining and laterally surrounding a spacing region of the n-type epitaxy layer. P-type dopant ions are implanted into the spacing region to form a p-type buried layer, with the p-type buried layer laterally extending into the segmented p-well about the spacing region and completely separating an underlying portion of the n-type epitaxy layer in relation to the p-type buried layer and an overlying portion of the n-type epitaxy layer in the spacing region. A collector region is formed in the overlying portion of the n-type epitaxy layer in the spacing region.

BRIEF DESCRIPTION OF THE DRAWINGS

The present invention will hereinafter be described in conjunction with the following drawing figures, wherein like numerals denote like elements.

DETAILED DESCRIPTION

Figure 1:
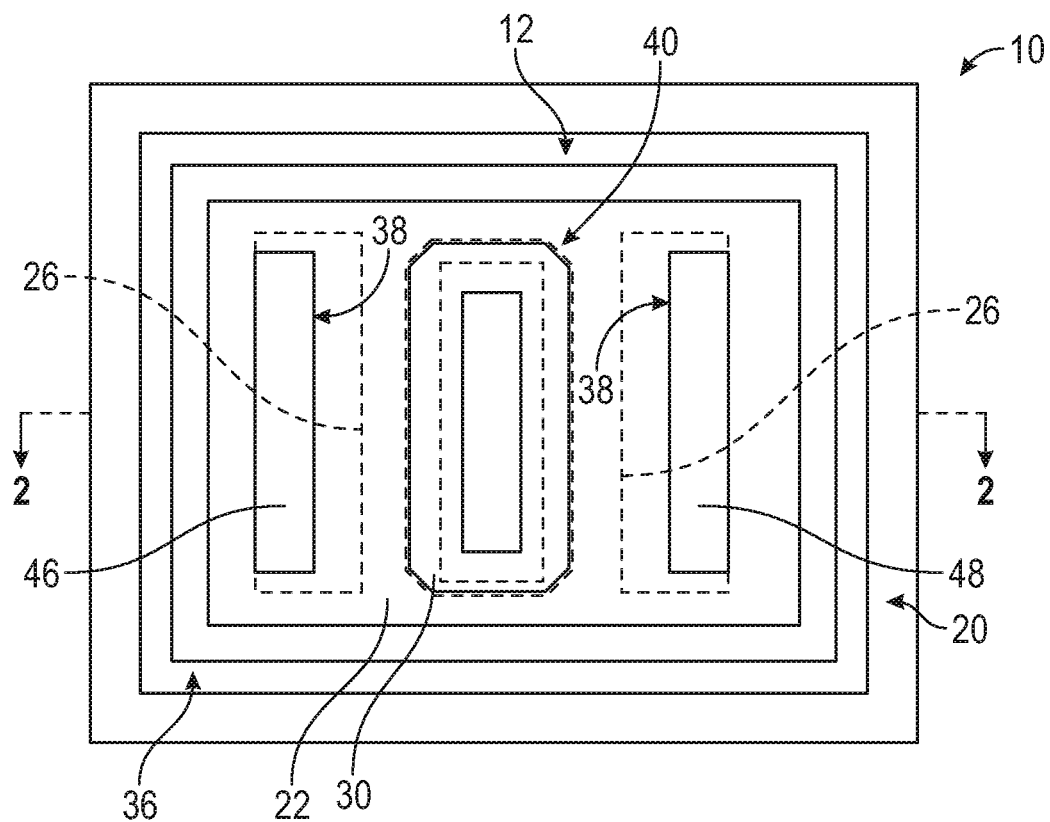
FIG. 1 is a schematic top view of an integrated circuit including an electrostatic discharge device in accordance with an embodiment.

The following detailed description is merely exemplary in nature and is not intended to limit the integrated circuits including an electrostatic discharge device or methods of forming the integrated circuits as described herein. Furthermore, there is no intention to be bound by any theory presented in the preceding background or the following detailed description.

Embodiments of the present disclosure are generally directed to integrated circuits and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components in the integrated circuits.

Integrated circuits that include an electrostatic discharge (ESD) device and methods of forming the integrated circuits are provided herein. The integrated circuit includes a segmented p-well that is formed in an n-type epitaxy layer, with the segmented p-well including spaced p-well regions that are isolated from direct physical contact with each other within the n-type epitaxy layer by a spacing region of the n-type epitaxy layer. An emitter contact of an electrostatic discharge device is formed in at least one of the spaced p-well region. A p-type buried layer is formed in the spacing region of the n-type epitaxy layer. The p-type buried layer physically contacts the respective spaced p-well regions of the segmented p-well, with the p-type buried layer and the p-well regions, as well as any other p-type features in the ESD device, collectively forming a base region. A collector region is formed over the p-type buried layer. With the features of the integrated circuit as described, ESD devices can be fabricated that exhibit a minimal change in failure current (It2) even when configured to have a higher holding voltage. Holding voltage is generally controlled by a critical dimension of certain features of the base region, with increases in the critical dimension providing a corresponding increase in holding voltage for the ESD device. For example, in an embodiment, lateral dimension of a first p-type subregion, which is part of the base region, influences holding voltage with an increase in the lateral dimension (i.e., with the first p-type subregion extended closer to the collector region) providing a corresponding increase in holding voltage for the ESD device. Whereas conventional devices exhibit a decrease in failure current (It2) with an increase in holding voltage (Vh), it is believed that this phenomenon is due to the configuration of the p-well regions (being deep p-wells) along with the configuration and presence of the p-type buried layer as well as current flow dynamics between the emitter contact and the collector region. Increasing the critical dimension of certain features of the base region, holding voltage (Vh) can be improved to a required level while the designed deep p-well provides a vertical path for the current to go deeper into the deep p-well which touches the p-type buried layer, allowing the current flows to collector region. Normally, the increase in the critical dimension of certain features of the base region will decrease the failure current (It2), but it is believed that the additional vertical current path compensates this negative effect, exhibiting less variation in failure current (It2) as a function of change in holding voltage (Vh) due to change in critical dimension of the certain features of the base region.

An embodiment of an integrated circuit 10 that includes an electrostatic discharge (ESD) device 12 will now be described with reference to FIGS. 1 and 2. The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit 10 can be operated in any orientation. As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under", "lateral"

and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

The ESD devices 12 as described herein are commonly known as NPN bipolar devices, and the ESD devices 12 operate through known principles associated with NPN bipolar device functionality. In particular, NPN devices represent one of the two types of bipolar transistors and generally include a P-doped semiconductor region (the "base") disposed in electrical series between two N-doped regions (the "emitter" and the "collector"). The NPN device operates by passing electrons from the emitter to the collector (so conventional current flows from collector to emitter). The emitter "emits" electrons into the base, which controls the number of electrons the emitter emits. Most of the electrons emitted are "collected" by the collector, which sends them along to the next part of the circuit.

Figure 2:
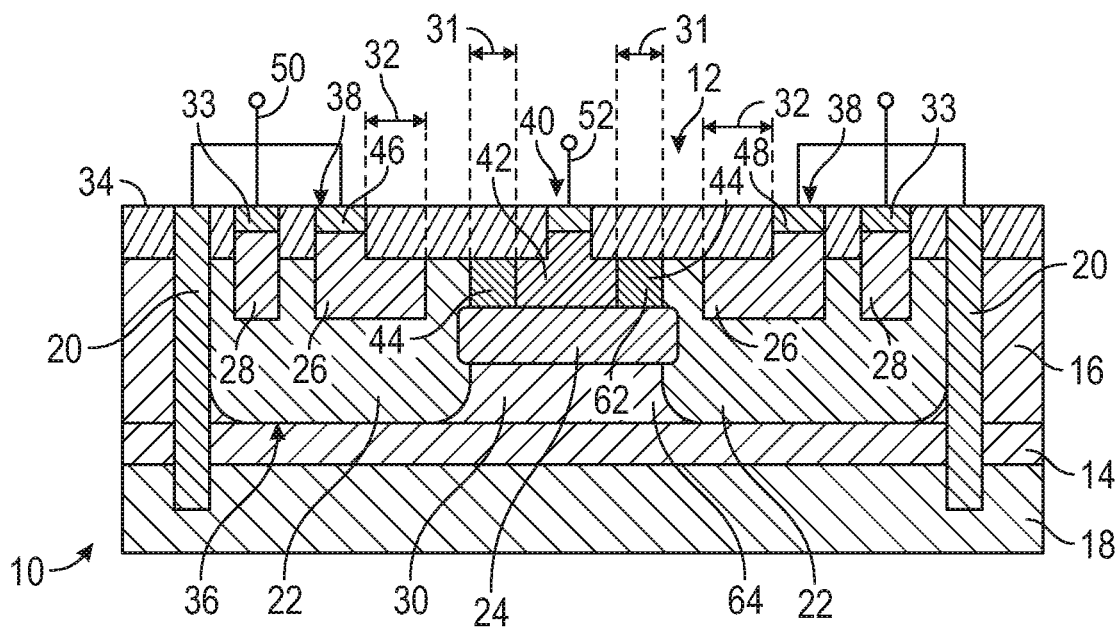
FIG. 2 is a schematic cross-sectional side view of the integrated circuit including the electrostatic discharge device of FIG. 1 shown along plane 2-2.

Referring to FIGS. 1 and 2, the integrated circuit 10 includes a semiconductor substrate having an n-type buried layer 14 and an n-type epitaxy layer 16 disposed over the n-type buried layer 14. As referred to herein, the term "semiconductor substrate" may include any semiconductor materials typically used in the formation of electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, and the like. In an exemplary embodiment, the n-type buried layer 14 and the n-type epitaxy layer 16 include silicon that is doped with n-type dopant ions including, but not limited to, phosphorus, arsenic, antimony, and combinations thereof. In embodiments and as shown in FIG. 2, the n-type buried layer 14 is formed in a p-type semiconductor substrate 18 by implanting n-type dopant ions therein, and the n-type epitaxy layer 16 is formed by epitaxially growing silicon doped with n-type dopant ions over the n-type buried layer 14. Typical p-type dopant ions include, but are not limited to, boron, aluminum, gallium, indium, and combinations thereof.

Referring again to FIGS. 1 and 2, in embodiments, a deep trench isolation structure 20 extends through the n-type epitaxy layer 16 and the n-type buried layer 14, with the deep trench isolation structure 20 surrounding and isolating the electrostatic discharge device 12 in the n-type epitaxy layer 16. More particularly, the deep trench isolation structure 20 isolates a portion of the n-type epitaxy layer 16 within which the electrostatic discharge device 12 is formed, with the n-type epitaxy layer 16 and the n-type buried layer 14 both physically contacting the deep trench isolation structure 20.

As alluded to above, the electrostatic discharge device 12 is an NPN device that includes a base region 36, an emitter region 38, and a collector region 40. Referring to FIGS. 1 and 2, the base region 36 of the electrostatic discharge device 12 includes a segmented p-well 22, a p-type buried layer 24, a first p-type subregion 26 in the segmented p-well 22, and a second p-type subregion 28 also formed in the segmented p-well 22, which combine to provide the function associated with the base region 36 of the NPN device 12. As referred to herein, the "segmented p-well" includes spaced p-well regions 22 that are interrupted by a spacing region 30 of the n-type epitaxy layer 16, and the segmented p-well 22 also includes the p-type subregions 26, 28 (which have a different concentration of p-type dopant ions than the rest of the segmented p-well 22) formed therein to provide the "segmented" character thereto. The spacing region 30 of the n-type epitaxy layer 16 is juxtaposed between opposing sides of segmented p-well 22, with the segmented p-well 22 defining a boundary of and laterally surrounding the spacing region 30 (as best shown in FIG. 1). More particularly, the segmented p-well 22 is laterally bounded by the spacing region 30 and the deep trench isolation structure 20. In embodiments, the segmented p-well 22 laterally contacts the deep trench isolation structure 20 and also abuts the n-type buried layer 14, as best shown in FIG. 2. In embodiments, the segmented p-well 22 has a doping gradient to a depth below a lower boundary of the p-type buried layer 24, which provides maximized vertical current path to the ESD device 12. In specific embodiments, the segmented p-well 22 has a p-type doping gradient to a depth of at least 4 microns into the n-type epitaxy layer 16.

As alluded to above, the base region 36 of the electrostatic discharge device 12 further includes the first p-type subregion 26. More particularly, referring to FIGS. 1 and 2, first p-type subregions 26 of the electrostatic discharge device 12 are formed in lateral portions of the segmented p-well 22 relative to the spacing region 30, with the first p-type subregions 26 formed on opposing sides of the spacing region 30. The first p-type subregions 26 have a distinguishable p-type doping profile as compared to the p-well 22, with additional ion implantation conducted to form the first p-type subregions 26 after initial formation of the p-well 22 to form the first p-type subregions 26 with a higher p-type conductivity determining ion concentration than remaining parts of the p-well 22. The first p-type subregions 26 may have an adjustable lateral dimension 32 for purposes of setting holding voltage of the electrostatic discharge device 12. As described above, the integrated circuits 10 as described herein are capable of supporting a range of holding voltages (Vh), as set by varying the adjustable lateral dimension 32, with minimal effect on failure current (It2) due to the configuration of the segmented p-well 22. The adjustable lateral dimension 32 may be adjustable by virtue of controlling implantation pattern for the p-type dopant ions when forming the first p-type subregions 26.

Referring to FIG. 2, the base region 36 of the electrostatic discharge device 12 further includes the second p-type subregion 28 that is also formed in the segmented p-well 22, with the second p-type subregion 28 having a distinguishable doping profile as compared to the segmented p-well 22. The first p-type subregion 26 and the second p-type subregion 28 may be concurrently formed and, thus, may have a similar dopant profile to each other. A p-type base contact 33 is formed in the second p-type subregion 28, with the p-type base contact 33 having a distinguishable doping profile as compared to the second p-type subregion 28. More particularly, yet an additional ion implantation may be conducted to form the p-type base contact 33 after formation of the second p-type subregion 28 with the p-type base contact 33 having an even higher p-type conductivity determining ion concentration than the second p-type subregion 28. In embodiments, and as best illustrated in FIG. 1, the second p-type subregion 28 and the p-type base contact 33 form a ring disposed about the segmented p-well 22, and the second p-type subregion 28 and p-type base contact 33 laterally encompass the collector region 40 within the ring. Further, the first p-type subregions 26 are laterally encompassed by the ring of the second p-type subregion 28 and the p-type base contact 33. Notably, the p-type base contact 33 is only formed in the second p-type subregion 28, with the first p-type subregions 26 free of the p-type base contact 33. Referring to FIG. 2, shallow trench isolation structures 34 may be provided and patterned to define desired locations for formation of the first p-type subregions 26, the second p-type subregions 28, and the p-type base contact 33.

Referring again to FIG. 2, the base region 36 of the electrostatic discharge device 12 further includes the p-type buried layer 24, which is formed in the spacing region 30 of the n-type epitaxy layer 16. In embodiments, the p-type buried layer 24 has a distinguishable doping profile as compared to the segmented p-well 22. For example, the p-type buried layer 24 may have a higher concentration of p-type dopant ions as compared to the segmented p-well 22 by virtue of an additional and separate ion implantation employed to form the p-type buried layer 24 with formation of the p-type buried layer 24 conducted in a dedicated implantation operation. The segmented p-well 22 may also have a doping gradient to a depth below a lower boundary of the p-type buried layer 24. In embodiments, the p-type buried layer 24 laterally extends into the segmented p-well 22 about the spacing region 30 and impedes current flow between an underlying portion 64 of the n-type epitaxy layer 16 in relation to the p-type buried layer 24 and an overlying portion 62 of the n-type epitaxy layer 16 in the spacing region 30. With such configuration, the collector region 40 can be effectively defined and insulated by p-type material on all sides thereof, with the segmented p-well 22 laterally surrounding the collector region 40 and the p-type buried layer 24 completely separating the collector region 40 from portions of the n-type epitaxy layer 16 that lie beneath the p-type buried layer 24.

As alluded to above, and as shown in FIGS. 1 and 2, the collector region 40 of the electrostatic discharge device 12 is formed in the spacing region 30 of the n-type epitaxy layer 16, particularly in the portion of n-type epitaxy layer 16 that overlies the p-type buried layer 24. The collector region 40, as referred to herein, includes all features in the portion of n-type epitaxy layer 16 that overlie the p-type buried layer 24 and that have an n-type character, as opposed to p-type character of the adjacent segmented p-well 22 and p-type buried layer 24. The collector region 40 is physically isolated by the p-type buried layer 24 from direct physical contact with the underlying portion 64 of the n-type epitaxy layer 16. In embodiments and as shown in FIG. 2, the collector region 40 includes an n-type collector well 42 and an n-type collector extension region 44 formed in the overlying portion 62 of the n-type epitaxy layer 16. Additionally, an n-type collector contact 45 is formed in the n-type collector well 42. The n-type collector well 42, the n-type collector extension region 44, and the n-type collector contact 45 are distinguishable by concentration of n-type dopant ions present therein. In particular, the n-type collector extension region 44 has a distinguishable doping profile as compared to the n-type collector well 42 and is laterally disposed between the n-type collector well 42 and the segmented p-well 22.

As alluded to above, and as shown in FIGS. 1 and 2, the electrostatic discharge device 12 further includes the emitter region 38. The emitter region 38 includes a first n-type emitter contact 46, which is formed in a first lateral portion of the segmented p-well 22 relative to the spacing region 30. More particularly, the first n-type emitter contact 46 is formed in the first p-type subregion 26. In embodiments, a second n-type emitter contact 48 of the electrostatic discharge device 12 is formed in a second lateral portion of the segmented p-well 22 relative to the spacing region 30. More particularly, in embodiments, the n-type emitter contacts 46, 48 are formed in the respective first p-type subregions 26 that are disposed on opposing sides of the spacing region 30. As shown in FIGS. 1 and 2, the first n-type emitter contact 46 and the second n-type emitter contact 48 are laterally encompassed by the ring of the second p-type subregion 28 and the p-type base contact 33. In embodiments, the emitter region 38 only includes the emitter contacts 46, 48 as the sole structures of the emitter region 38 in the electrostatic discharge device 12.

Electrical connections may be established to the base region 36, the emitter region 38, and the collector region 40 to enable effective function of the electrostatic discharge device 12. In an embodiment, the deep trench isolation structures 20, the base region 36 (through the base contact 33), and the emitter region 38 (through one of the emitter contacts 46, 48) are electrically connected through a common metal line 50. Separately, the collector region 40 (through the collector contact 45) is connected to a collector metal line 52.

An exemplary method of forming the integrated circuit 10 that includes the electrostatic discharge device 12, as shown in FIGS. 1 and 2, will now be described with common features described above and in the following description of the method being the same. The semiconductor substrate is provided that includes the n-type buried layer 14 and the n-type epitaxy layer 16 formed over the n-type buried layer 14, which features may be formed through conventional techniques. Shallow trench isolation structures 34 may be formed and patterned over and in the n-type epitaxy layer 16 for purposes of defining features to be included in the base region 36, the emitter region 38, and the collector region 40. P-type dopant ions are then implanted into the n-type epitaxy layer 16 to form the segmented p-well 22 in the n-type epitaxy layer 16, with the segmented p-well 22 defining and laterally surrounding the spacing region 30 of the n-type epitaxy layer 16. More particularly, the spacing region 30 is a remaining portion of the n-type epitaxy layer 16 that is not subject to p-type ion implantation during formation of the segmented p-well 22. Deep trench isolation structures 20 are then formed adjacent to the segmented p-well 22, although it is to be appreciated that the deep trench isolation structures 20 may alternatively be formed prior to formation of the segmented p-well 22. P-type dopant ions are then implanted into the spacing region 30 through an additional ion implantation operation that is separate from ion implantation that forms the segmented p-well 22 to form the p-type buried layer 24. The p-type buried layer 24 laterally extends into the segmented p-well 22 about the spacing region 30. The collector region 40 is then formed in the overlying portion 62 of the n-type epitaxy layer 16 that overlies the p-type buried layer 24 in the spacing region 30. More particularly, the n-type collector extension region 44 may be formed by implanting n-type dopant ions. An additional and separate n-type ion implantation operation may be conducted to form the n-type collector well 42, with a lateral dimension 31 of the n-type collector extension region 44 controlled at least in part by configuring the n-type collector well 42 during ion implantation. P-type dopant ions are then into implanted into the segmented p-well 22 to form the first p-type subregion 26 and the second p-type subregion 28 in the above-described configurations. Additional ion implantation operations are then conducted to form the contacts 33, 45, 46, 48. More particularly, n-type dopant ions may be implanted into the collector well 42 and the first p-type subregions 26 to form the n-type collector contact 45 and the first and second n-type emitter contacts 46, 48, respectively. P-type dopant ions may be implanted into the second p-type subregion 28 to form the p-type base contact 33. Back-end-of-line (BEOL) metallization may then be conducted to form metal lines 50, 52 as described above.

Performance of the integrated circuits 10 that include the ESD device 12 as described herein will now be addressed. In particular, referring to TABLE I below, the effect of different lateral dimensions 31, 32 on holding voltage (Vh) and triggering voltage (Vt) is illustrated:

TABLE I

| Devices | Dimension 32 (um) | Vh (V) | Dimension 31 (um) | Vt (V) |
| --- | --- | --- | --- | --- |
| Ex. 1 | 0.5 | 17.5 | 0.5 | 27 |
| Ex. 2 | 1.5 | 24.5 | 1.5 | 45 |
| Ex. 3 | 2 | 25 | 1.5 | 45 |
| Ex. 4 | 3 | 26 | 1.5 | 45 |
| Ex. 5 | 4 | 27 | 1.5 | 45 |

Based upon the data shown in TABLE I, it can be seen that as lateral dimension 32 (i.e., width of the first p-type subregion 26) increases, the holding voltage (Vh) exhibits a corresponding increase ranging from 17.5V to 27V. Further, the triggering voltage (Vt) as defined by lateral dimension 31 (i.e., the width of the extension region 44) is decoupled from corresponding change in lateral dimension 32, thereby allowing Vh to be adjustable without impacting Vt. Further, integrated circuits 10 including ESD devices 12 represented by Examples 1-5 of TABLE I above were observed to exhibit a minimal change in failure current (It2), thus illustrating the ability to achieve a higher Vh with the integrated circuits 10 as described herein with minimal impact on It2.

Figure 3:
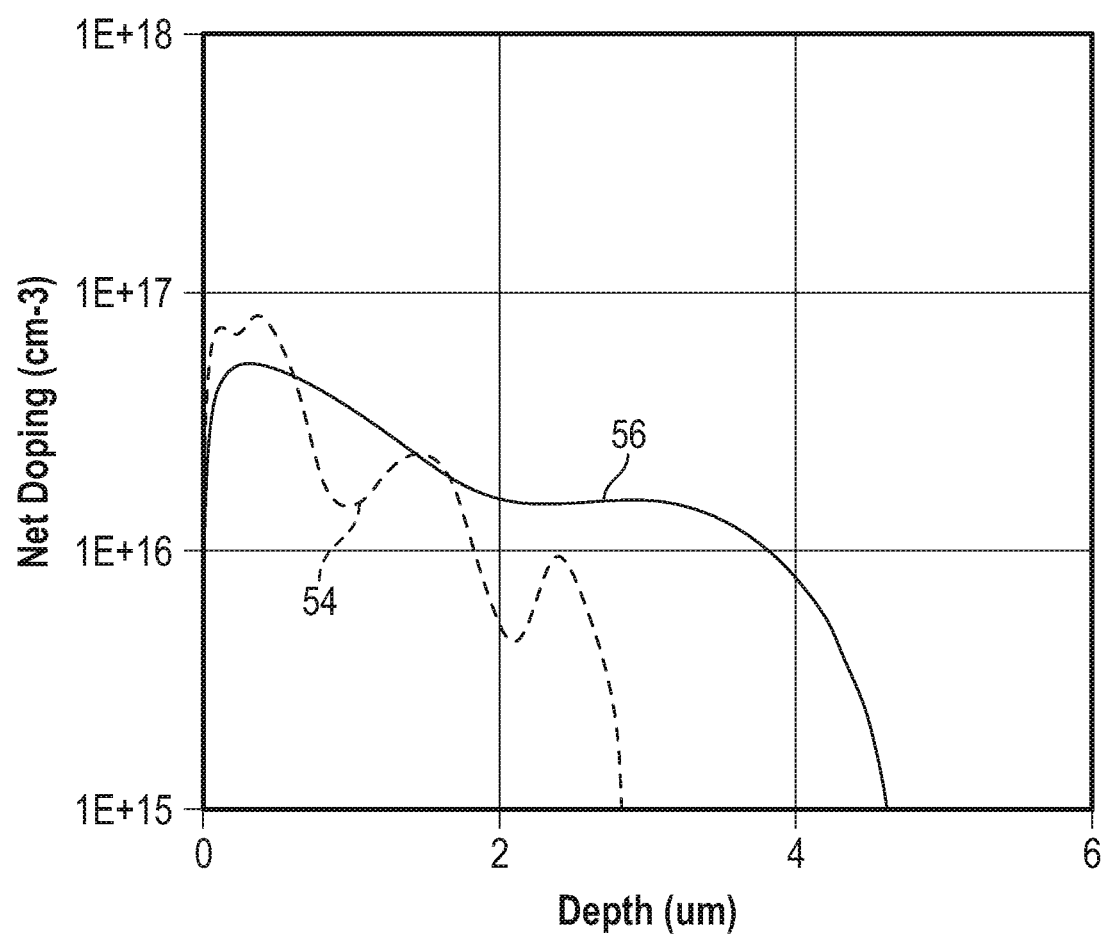
FIG. 3 is a graph illustrating doping profiles as net doping versus depth for two different integrated circuits having a segmented p-well, with different doping depths for the respective integrated circuits in the segmented p-well.
Figure 4:
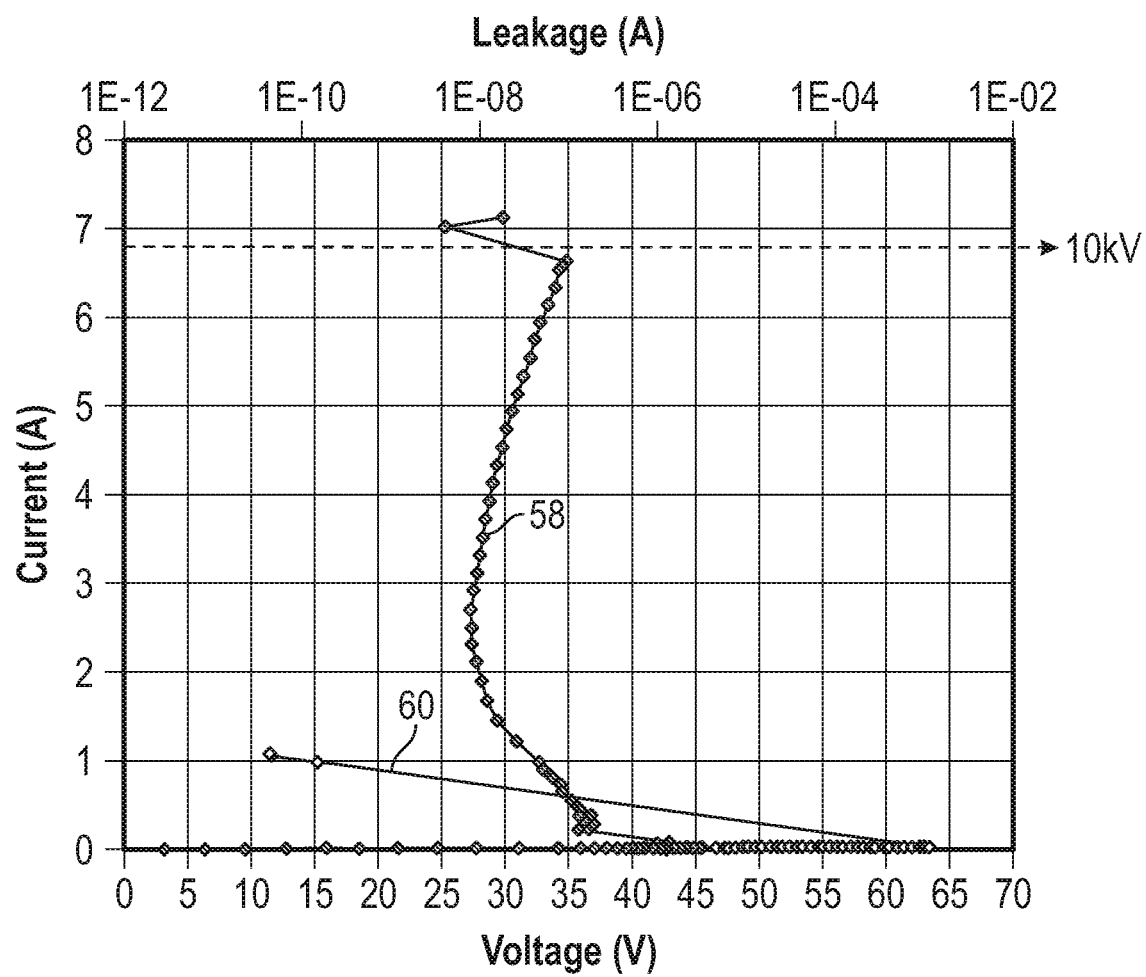
FIG. 4 is a graph illustrating current versus voltage during an electrostatic discharge event for the integrated circuits having the doping profiles as shown in FIG. 3.

Referring to FIGS. 3 and 4, effect on performance of integrated circuit configurations that include the ESD device 12 as described herein are addressed in comparison to a comparative device that has a modified configuration of the segmented p-well 22. More particularly, referring to FIG. 3, the comparative device includes a p-well 22 having a doping profile 54 with net doping only extending down to about even level with a lower boundary of the p-type buried layer 24, whereas the integrated circuit 10 with segmented p-well 22 has a doping profile 56 that extends much deeper into the semiconductor substrate, below the lower boundary of the buried p-type layer and contacting the n-type buried layer 14.

Referring to FIG. 4, current versus voltage is shown for the respective integrated circuits 10 having the doping profiles 54, 56 as shown in FIG. 3, with curve 58 corresponding to the integrated circuit 10 having the doping profile 56 and with curve 60 corresponding to the integrated circuit 10 having the doping profile 54. As shown in FIG. 4, the integrated circuits 10 having doping profile 56 exhibit robust performance in terms of failure current (It2), with curve 58 exhibiting a failure current (It2) of ~6.7 A vs. curve 60, which exhibited early failure at <100 mA.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing an exemplary embodiment. It being understood that various changes may be made in the function and arrangement of elements described in an exemplary embodiment without departing from the scope as set forth in the appended claims.

What is claimed is:

1. An integrated circuit including an electrostatic discharge device, the integrated circuit comprising:
   an n-type epitaxy layer;
   a segmented p-well formed in the n-type epitaxy layer, the segmented p-well defining and laterally surrounding a spacing region of the n-type epitaxy layer;
   a p-type buried layer formed in the spacing region of the n-type epitaxy layer, the p-type buried layer laterally extending into the segmented p-well about the spacing region, and the p-type buried layer arranged between an underlying portion of the n-type epitaxy layer in relation to the p-type buried layer and an overlying portion of the n-type epitaxy layer in the spacing region; and
   a collector region of the electrostatic discharge device formed in the overlying portion of the n-type epitaxy layer in the spacing region.

2. The integrated circuit of claim 1, further comprising:
   an n-type buried layer, wherein the n-type epitaxy layer is disposed over the n-type buried layer.

3. The integrated circuit of claim 2, wherein the segmented p-well abuts the n-type buried layer.

4. The integrated circuit of claim 2, wherein the segmented p-well has a p-type doping gradient to a depth of at least 4 microns into the n-type epitaxy layer.

5. The integrated circuit of claim 1, wherein the segmented p-well has a doping gradient to a depth below a lower boundary of the p-type buried layer.

6. The integrated circuit of claim 1, wherein a first n-type emitter contact of the electrostatic discharge device is formed in a first lateral portion of the segmented p-well relative to the spacing region.

7. The integrated circuit of claim 6, further comprising:
   a second n-type emitter contact of the electrostatic discharge device formed in a second lateral portion of the segmented p-well relative to the spacing region,
   wherein the second lateral portion is on an opposing side of the spacing region from the first lateral portion of the segmented p-well.

8. The integrated circuit of claim 7, wherein the first and second n-type emitter contacts are formed in a first p-type subregion in the segmented p-well, the first p-type subregion has a distinguishable doping profile as compared to the segmented p-well, and the first p-type subregion is part of a base region of the electrostatic discharge device.

9. The integrated circuit of claim 1, wherein a base region of the electrostatic discharge device comprises the segmented p-well and the p-type buried layer.

10. The integrated circuit of claim 9, wherein the base region further comprises a second p-type subregion formed in the segmented p-well and a p-type base contact formed in the second p-type subregion, and the second p-type subregion has a distinguishable doping profile as compared to the segmented p-well and the p-type base contact has a distinguishable doping profile as compared to the second p-type subregion.

11. The integrated circuit of claim 10, wherein the second p-type subregion and the p-type base contact form a ring disposed about the segmented p-well and laterally encompass the collector region within the ring.

12. The integrated circuit of claim 11, wherein a first n-type emitter contact of the electrostatic discharge device is formed in a first lateral portion of the segmented p-well relative to the spacing region, a second n-type emitter contact of the electrostatic discharge device is formed in a second lateral portion of the segmented p-well relative to the spacing region, the second lateral portion is on an opposing side of the spacing region from the first lateral portion of the segmented p-well, and the first n-type emitter contact and the second n-type emitter contact are laterally encompassed by the ring of the second p-type subregion and the p-type base contact.

13. The integrated circuit of claim 2, further comprising:
a deep trench isolation structure extending through the n-type epitaxy layer and the n-type buried layer,
wherein the deep trench isolation structure surrounds and isolates the electrostatic discharge device in the n-type epitaxy layer.

14. The integrated circuit of claim 13, wherein the segmented p-well laterally contacts the deep trench isolation structure.

15. The integrated circuit of claim 1, wherein the collector region is physically isolated by the p-type buried layer from direct physical contact with underlying portions of the n-type epitaxy layer, and the collector region comprises an n-type collector well and an n-type collector extension region formed in the overlying portion of the n-type epitaxy layer.

16. The integrated circuit of claim 15, wherein the n-type collector extension region has a distinguishable doping profile as compared to the n-type collector well and is laterally disposed between the n-type collector well and the segmented p-well.

17. An integrated circuit including an electrostatic discharge device, the integrated circuit comprising:
an n-type epitaxy layer;
a segmented p-well formed in the n-type epitaxy layer, the segmented p-well defining and laterally surrounding a spacing region of the n-type epitaxy layer;
a p-type buried layer formed in the spacing region of the n-type epitaxy layer, the p-type buried layer having a distinguishable doping profile as compared to the segmented p-well, and the p-type buried layer is arranged between an underlying portion of the n-type epitaxy layer in relation to the p-type buried layer and an overlying portion of the n-type epitaxy layer in the spacing region, wherein a base region comprises:
first p-type subregions of the electrostatic discharge device formed in lateral portions of the segmented p-well relative to the spacing region, the first p-type subregions formed on opposing sides of the spacing region;
a second p-type subregion formed in the segmented p-well and a p-type base contact formed in the second p-type subregion, the second p-type subregion has a distinguishable doping profile as compared to the segmented p-well and the p-type base contact has a distinguishable doping profile as compared to the second p-type subregion, and the second p-type subregion and the p-type base contact form a ring disposed about the segmented p-well with the first p-type subregions laterally encompassed by the ring of the second p-type subregion and the p-type base contact;
n-type emitter contacts formed in the respective first p-type subregions; and
a collector region of the electrostatic discharge device formed in the overlying portion of the n-type epitaxy layer in the spacing region.

18. A method of forming an integrated circuit including an electrostatic discharge device, the method comprising:
providing a semiconductor substrate comprising an n-type buried layer and an n-type epitaxy layer formed over the n-type buried layer;
implanting p-type dopant ions into the n-type epitaxy layer to form a segmented p-well in the n-type epitaxy layer, wherein the segmented p-well defines and laterally surrounds a spacing region of the n-type epitaxy layer;
implanting p-type dopant ions into the spacing region to form a p-type buried layer, wherein the p-type buried layer laterally extends into the segmented p-well about the spacing region, and the p-type buried region is arranged between an underlying portion of the n-type epitaxy layer in relation to the p-type buried layer and an overlying portion of the n-type epitaxy layer in the spacing region; and
forming a collector region in the overlying portion of the n-type epitaxy layer in the spacing region.

19. The method of claim 18, further comprising:
implanting p-type dopant ions into the segmented p-well to form a first p-type subregion and a second p-type subregion,
wherein the second p-type subregion is formed as a ring laterally encompassing the first p-type subregion, and the first p-type subregion and the second p-type subregion have a distinguishable doping profile as compared to the segmented p-well.

20. The method of claim 19, further comprising:
implanting n-type dopant ions into the first p-type subregion to form an n-type emitter contact; and
implanting p-type dopant ions into the second p-type subregion to form a p-type base contact.

* * * * *